(12) United States Patent
Margomenos et al.

(10) Patent No.: US 9,059,140 B1
(45) Date of Patent: Jun. 16, 2015

(54) SIMULTANEOUS CONTROLLED DEPTH HOT EMBOSSING AND ACTIVE SIDE PROTECTION DURING PACKAGING AND ASSEMBLY OF WIDE BANDGAP DEVICES

(71) Applicant: HRL Laboratories, LLC, Malibu, CA (US)

(72) Inventors: Alexandros D. Margomenos, Pasadena, CA (US); Miroslav Micovic, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/054,572

(22) Filed: Oct. 15, 2013

(51) Int. Cl.
  *H01L 23/48* (2006.01)
  *H01L 23/42* (2006.01)
  *H01L 23/00* (2006.01)
  *H01L 21/56* (2006.01)
  *H01L 21/683* (2006.01)

(52) U.S. Cl.
  CPC .............. *H01L 23/42* (2013.01); *H01L 24/96* (2013.01); *H01L 24/73* (2013.01); *H01L 21/561* (2013.01); *H01L 21/6835* (2013.01)

(58) Field of Classification Search
  CPC ... H01L 21/6835; H01L 21/561; H01L 23/36; H01L 23/3677; H01L 24/73; H01L 24/96; H01L 24/20
  See application file for complete search history.

(56) References Cited

U.S. PATENT DOCUMENTS

| | | | |
|---|---|---|---|
| 5,276,455 A | 1/1994 | Fitzsimmons et al. | |
| 6,249,439 B1 | 6/2001 | DeMore et al. | |
| 6,900,765 B2 | 5/2005 | Navarro et al. | |
| 6,989,592 B2 | 1/2006 | Chang et al. | |
| 7,271,479 B2 | 9/2007 | Zhao et al. | |
| 7,292,381 B1* | 11/2007 | Patterson et al. | 359/248 |
| 7,364,063 B2 | 4/2008 | Schaenzer et al. | |
| 7,683,469 B2 | 3/2010 | Oh et al. | |
| 7,733,265 B2 | 6/2010 | Margomenos et al. | |
| 7,777,315 B2 | 8/2010 | Noquil | |
| 7,808,013 B2 | 10/2010 | Mendendorp, Jr. et al. | |
| 8,334,592 B2 | 12/2012 | Bhagwagar et al. | |
| 8,617,927 B1 | 12/2013 | Margomenos et al. | |
| 2003/0006499 A1* | 1/2003 | Choi | 257/700 |
| 2006/0027635 A1 | 2/2006 | Schaenzer et al. | |
| 2006/0091509 A1 | 5/2006 | Zhao et al. | |

(Continued)

OTHER PUBLICATIONS

K-C Chen et al., Thermal management and novel package design of high power light emitting diodes, National Cheng Kung University, Taiwan, *Electronic Components and Technology Conference*, 2008.

R. Feeler et al., Next-generation microchannel coolers, Northrop Grumman, *Proceedings of* SPIE 2008.

(Continued)

*Primary Examiner* — A. Sefer
(74) *Attorney, Agent, or Firm* — Ladas & Parry

(57) ABSTRACT

A method of mounting a plurality of semiconductor or microelectronic chips or dies, the method including providing a carrier, temporarily adhering the plurality of semiconductor or microelectronic chips or dies to the carrier with active faces of the chips or dies facing towards the carrier, covering backsides of the chips and filling empty spaces between the chips or dies with a metallic material to thereby define an assembly of the chips or dies and the metallic material, and releasing the assembly from the carrier, wherein each chip or die comprises at least one bonding ring higher than a height of the active face of the respective chip or die or any connections on the active face of the respective chip or die.

10 Claims, 11 Drawing Sheets

(56) References Cited

U.S. PATENT DOCUMENTS

| | | |
|---|---|---|
| 2006/0292747 A1 | 12/2006 | Loh |
| 2007/0075420 A1 | 4/2007 | Lu et al. |
| 2007/0247851 A1 | 10/2007 | Villard |
| 2008/0099770 A1 | 5/2008 | Mendendorp et al. |
| 2008/0128897 A1 | 6/2008 | Chao |
| 2008/0179725 A1* | 7/2008 | Chia et al. .................... 257/676 |
| 2008/0298021 A1 | 12/2008 | Ali et al. |
| 2009/0108437 A1 | 4/2009 | Raymond |
| 2009/0134421 A1 | 5/2009 | Negley |
| 2009/0294941 A1 | 12/2009 | Oh et al. |
| 2009/0309209 A1* | 12/2009 | Chen ............................ 257/690 |
| 2010/0140799 A1* | 6/2010 | Do et al. ...................... 257/737 |
| 2010/0327465 A1 | 12/2010 | Shen et al. |
| 2012/0217627 A1 | 8/2012 | Tseng et al. |

OTHER PUBLICATIONS

From U.S. Appl. No. 13/306,827 (now U.S. Patent No. 8,617,927), Application and Office Actions, including but not limited to the Office Actions mailed on Aug. 15, 2013, Mar. 7, 2013, and Jan. 9, 2013.

From U.S. Appl. No. 14/080,691, Application and Office Actions.

From U.S. Appl. No. 14/286,923 (unpublished, non publication request filed), Application and Office Actions.

Margomenos, A. et al. For "Wafer-Level Packaging Method Incorporating Embedded Thermal Management for GaN-Based RF Front-Ends," IEEE Intersociety Conference on Thermal and Thermomechanical Phenomena in Electronic Systems (ITHERM), May 27-30, 2014 in Orlando, Florida.

U.S. Appl. No. 14/386,923, filed May 23, 2014, Margomenos.

* cited by examiner

1. Temporary wafer mounting

2. Heat sink electroforming

3. Heat sink planarization

4. Release and form optically defined interconnects

SIMULTANEOUS CONTROLLED DEPTH HOT EMBOSSING AND ACTIVE SIDE PROTECTION DURING PACKAGING AND ASSEMBLY OF WIDE BANDGAP DEVICES

STATEMENT REGARDING FEDERAL FUNDING

This invention was made under U.S. Government contract DARPA FA8650-11-C-7110. The U.S. Government has certain rights in this invention.

CROSS REFERENCE TO RELATED APPLICATIONS

This application is related to pending U.S. patent application Ser. No. 13/306,827, filed Nov. 29, 2011, which is incorporated herein as though set forth in full.

TECHNICAL FIELD

This disclosure relates to thermal management for electronic circuits, and in particular for circuits that operate at high power densities.

BACKGROUND

Thermal management is a critical bottleneck to the performance and reliability of microelectronic circuits and systems. The situation worsens as the sizes of the microelectronic systems reduce and their power consumption increases due to added functionality. Wide-bandgap GaN and SiC devices operate at much higher power densities compared to Si and GaAs devices and also generate more heat. In addition, the trend for dimensional scaling and 3D integration for size and weight reduction creates a very challenging environment for all microelectronic systems. For example, 3D integration and multi-layer stacking compound the problem by embedding heat generating power amplifiers (PAs) inside a multi-layer stack surrounded by high thermal resistance layers separated from a heat sink.

Further, GaN technology, especially large-scale phased arrays of GaN devices, requires addressing the heat management problem while still maintaining ease of access to the devices for low RF loss and reduced parasitics. GaN devices produce heat fluxes in excess of 1 kW/cm$^2$, which are difficult to dissipate using existing cooling technologies. Conventional assembly methods rely on mounting GaN MMIC on metallic heat sinks, which may be Cu, CuW, and other suitable heat sinks, and utilizing thermal interface materials (TIMs), such as silver epoxy and AuSn solder. Such TIMs have low thermal conductivities which become a bottleneck in cooling GaN devices and can cause serious reliability problems due to the potential existence of air voids.

Next generation RF front-ends for EW, Radar and communication systems will incorporate GaN circuits for power, linearity and robustness in both the receiver and transmitter paths and CMOS and/or SiGe components for signal processing and beamforming. This combination of components in dense packaging requires improved thermal management.

U.S. patent application Ser. No. 13/306,827, filed Nov. 29, 2011 describes a method for packaging, assembling and cooling GaN and other types of integrated circuits (ICs) by forming a free-standing electroformed heat sink within which all the components may be embedded. One method described in U.S. patent application Ser. No. 13/306,827 is shown in FIG. 1, which is further discussed below. The resulting assembly shown in step 4 of FIG. 1 is called an Integrated Thermal Array Plate (ITAP).

There are problems that occur in the making of an ITAP. Integrated circuits (ICs) may not be uniformly mounted on the carrier substrate, and the active faces of the ICs may not be protected during mounting. The embodiments of the present disclosure answer these and other needs.

SUMMARY

In a first embodiment disclosed herein, a method of mounting a plurality of semiconductor or microelectronic chips or dies, comprises providing a carrier, temporarily adhering said plurality of semiconductor or microelectronic chips or dies to said carrier with active faces of said chips or dies facing towards said carrier, covering backsides of said chips and filling empty spaces between said chips or dies with a metallic material to thereby define an assembly of said chips or dies and said metallic material, and releasing the assembly from said carrier, wherein each chip or die comprises at least one bonding ring higher than a height of the active face of the respective chip or die or any connections on the active face of the respective chip or die.

In another embodiment disclosed herein, an interconnection, packaging and cooling apparatus for a plurality of microelectronic chips or dies comprises the microelectronic chips or die in a desired configuration with their active faces all facing a common direction and with their active faces defining a common planar surface for all of said microelectronic chips, and a thermal heat sink disposed on backsides of the microelectronic chips, the thermal heat sink also disposed in spaces between adjacent microelectronic chips and on sidewalls of the microelectronic chips, wherein each chip or die comprises at least one bonding ring higher than a height of the active face of the respective chip or die or any connections on the active face of the respective chip or die.

In still another embodiment disclosed herein, a method of mounting a plurality of semiconductor or microelectronic chips or dies comprises depositing metal on each chip for forming a base layer for pads and interconnect and for forming a base layer for a first bonding ring, coating benzocyclobutene (BCB) over each chip device and curing the BCB, patterning and etching the BCB to expose the base layer for the pads and interconnect and to expose the base layer for the first bonding ring, and electroplating the base layer for the pads and interconnect to form pads and interconnects and electroplating the base layer for the first bonding ring to form the first bonding ring and a second bonding ring, wherein the second bonding ring is higher than the first bonding ring, wherein the first bonding ring has a larger area than the second bonding ring, and wherein the first and second bonding rings have a height greater than a height of the active face of the respective chip or die or any connections on the active face of the respective chip or die.

In still yet another embodiment disclosed herein, a method of mounting a plurality of semiconductor or microelectronic chips or dies comprises forming a base layer on each chip for pads, and forming a base layer on each chip for a first bonding ring, forming an air bridge for at least one chip by depositing a polyimide support bridge, depositing a metal conductor over the polyimide support bridge to form a conductor for the air bridge, depositing metal on the pads, electroplating nickel on the base layer for the first bonding ring on each chip, and depositing a layer of gold onto the nickel to form the first bonding ring and a second bonding ring, the thickness of the nickel being greater than the gold, wherein the second bonding ring is higher than the first bonding ring, wherein the first bonding ring has a larger area than the second bonding ring, and wherein the first and second bonding rings have a height greater than a height of the active face of the respective chip or die or any connections including the air bridge on the active face of the respective chip or die.

In still yet another embodiment disclosed herein, an interconnection, packaging and cooling apparatus for a plurality of microelectronic chips or dies comprises the microelectronic chips or die in a desired configuration with their active faces all facing a common direction and with their active faces defining a common planar surface for all of said microelectronic chips, and a thermal heat sink disposed on backsides of the microelectronic chips, the thermal heat sink also disposed in spaces between adjacent microelectronic chips and on sidewalls of the microelectronic chips, wherein each chip or die comprises at least one bonding ring higher than a height of the active face of the respective chip or die or any connections including any air bridge connections on the active face of the respective chip or die, and wherein the bonding ring comprises a thick layer of nickel.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure discloses an assembly and a method which allows the mounting of microelectronic integrated circuits (IC) with their active side or active face down on carrier substrates using polymer adhesives. A method is described for embedding an IC inside a polymer adhesive at a controlled depth. In addition the embedding may be a self-terminating process which stops the hot embossing of the IC into the polymer. At the same time, this disclosure provides for protection of the front active side or active face of the IC during the hot embossing process.

Figure 1:
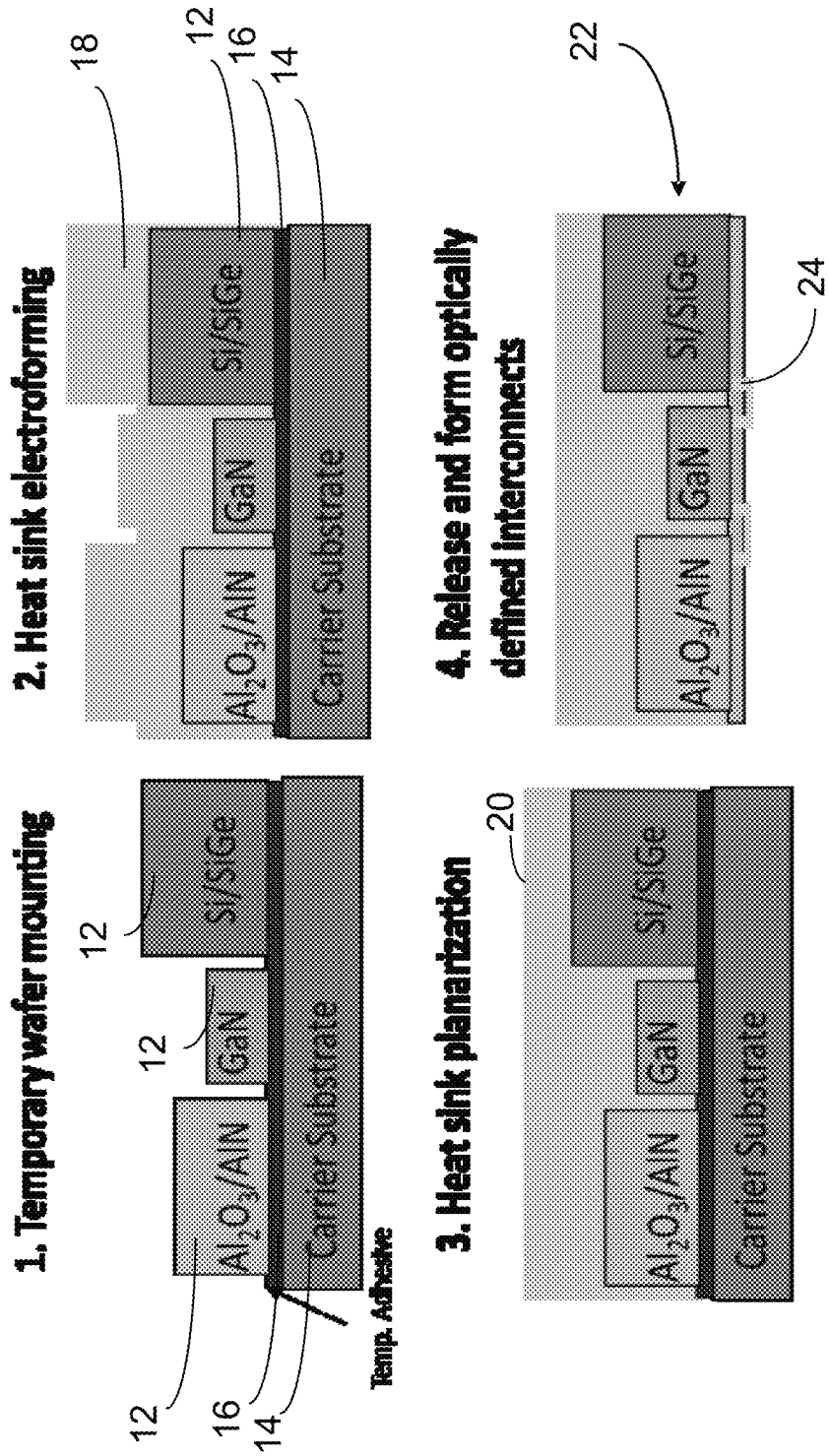
FIG. 1 shows a process flow for fabricating an integrated thermal array plate (ITAP) in accordance with the prior art.

FIG. 1 shows a process flow for assembly of an integrated thermal array plate (ITAP) for providing packaging, cooling and interconnection methods for high power circuits, in accordance to the prior art.

The method eliminates the need for a thermal interface material (TIM) by directly electroforming a void-free Cu, Ag, or composite metal heat sink on the backside of a monolithic microwave integrated circuit (MMIC), which is a circuit with multiple ICs or die. Since the various dice are acting as the mold around which the heat sink is electroformed, chips of various sizes and substrate thicknesses can be integrated on the same board which can be called an Integrated Thermal Array Plate (ITAP). The method enables the integration of thick AlN and $Al_2O_3$ substrates, which offer wide bandwidth and low-loss parasitics, within a thin GaN MMIC.

As shown in FIG. 1 in step 1, known good dice 12, which may be of various kinds, such as GaN, $Al_2O_3$/AlN and Si/SiGe among others, are picked and mounted, active face down, on a carrier substrate 14 coated with a temporary adhesive polymer 16. This ensures that upon release from the carrier, the active faces of the various components are coplanar, facilitating their subsequent interconnection.

Alignment marks on the carrier are used in conjunction with a die-bonding tool, such as a SET FC-300, to align and bond the various components. Chip-to-chip distances between die of 100-200 μm are easily achievable.

Then as shown in step 2 of FIG. 1, a heat sink 18 is electroformed on the backside of the various components, using the die 12 or integrated circuits (ICs) 12 as a plating mold. Next as shown in step 3 of FIG. 1, the heat sink 18 is planarized using chemical mechanical polishing (CMP) to form a planar surface 20. Then as shown in step 4 of FIG. 1, the carrier substrate 14 is released, leaving a free standing integrated thermal array plate (ITAP) 22.

The backsides of the chips or dies 12 may be covered with a seed metallic layer to make the backsides more compatible with the electroforming process. The seed metallic layer may be thin, and may be of a different composition than the seed metallic layer.

A key aspect of the method is that by optimizing and controlling the plating process the free standing ITAP is stress-free and fully planar. After release of the ITAP from the carrier, optically defined interconnects or conventional wire/ribbon bonds 24 can be used to connect the various components.

Figure 2:
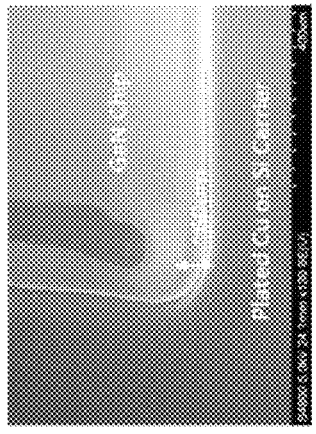
FIG. 2 shows optical and scanning electron images at stages of the process flow shown in FIG. 1 in accordance with the prior art.
Figure 2:
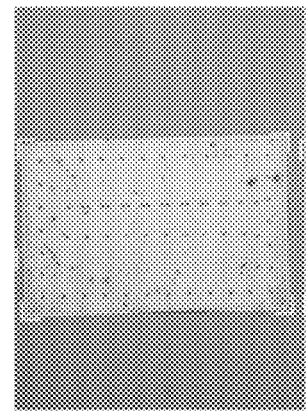
Figure 2:
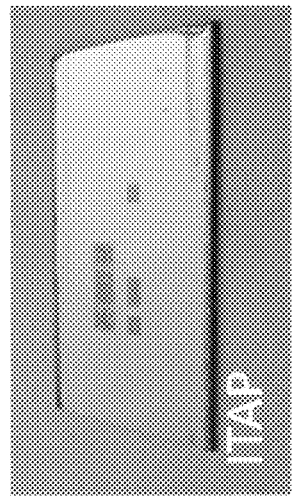
Figure 2:
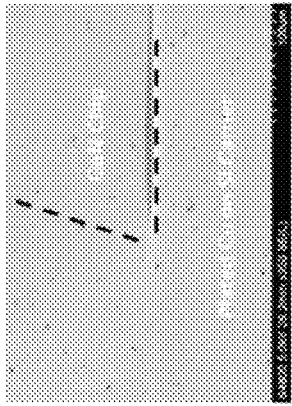

FIG. 2 shows photographs at each of the four stages of the method. The first step is mounting the ICs and other components on a carrier wafer. The second step is forming a heat sink, which may be Cu, by electroforming. The third step is planarizing the heat sink, and the fourth step is releasing the ITAP from the carrier wafer.

Figures 3A, 3B, 3C:
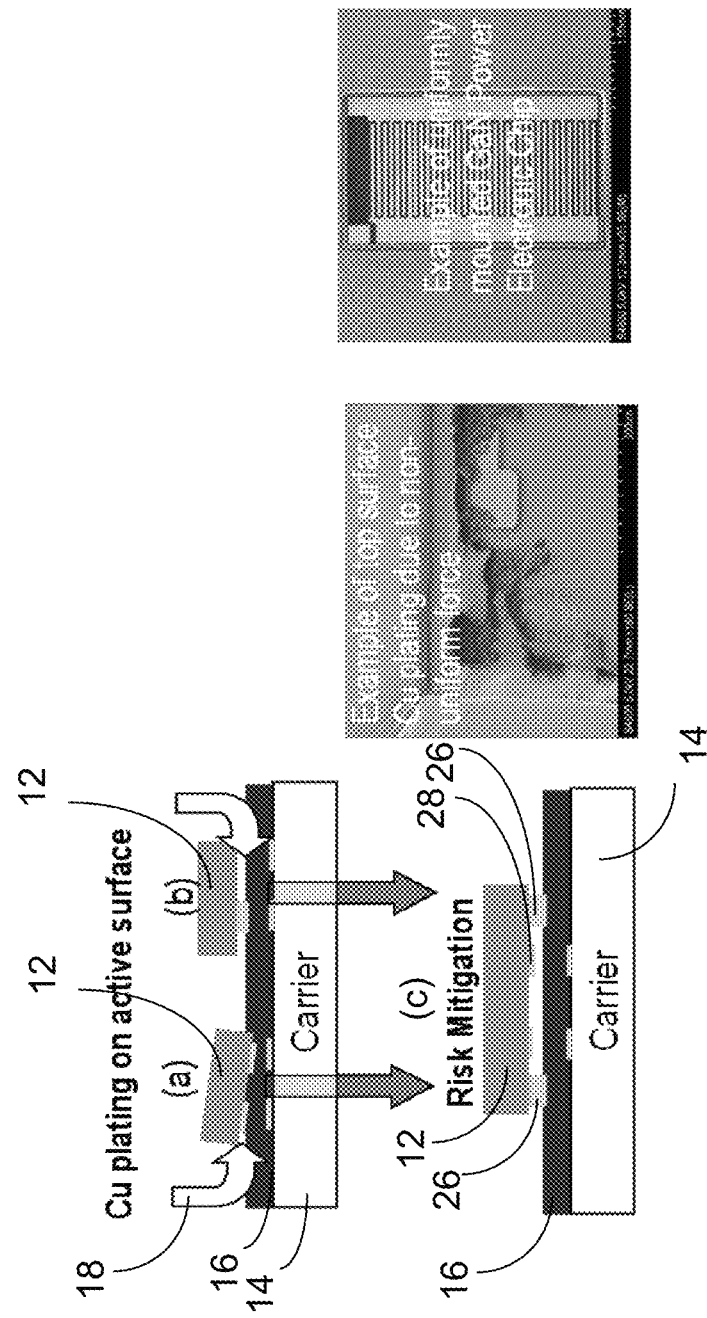
FIG. 3A shows a mounting step risk mitigation approach.
FIGS. 3B, 3C, and 3D show examples in accordance with the present disclosure

One of the risks of the method is that various integrated circuits (ICs) 12 may be mounted non-uniformly on the carrier wafer 14. A non-uniform bonding force can cause misalignment between a MMIC, IC or die 12 and the carrier wafer 14. This can be caused either by non-uniform bonding force during mounting, as shown by part (a) in FIG. 3A, or by an extreme surface topography of the MMICs, as shown by part (b) in FIG. 3A. If a die is mounted in a misaligned or non-uniform manner, then when metal is electroplated to form the heat sink, the metal 18 may also be electroplated on the active side of the IC, as shown in FIG. 3A parts (a) and (b). Clearly metal 18 formed on the active side of the IC can create short circuits and severely degrade the performance of the die or IC. FIG. 3B is a photograph of the active side of the IC being plated due to non-uniform force.

Figure 3D:
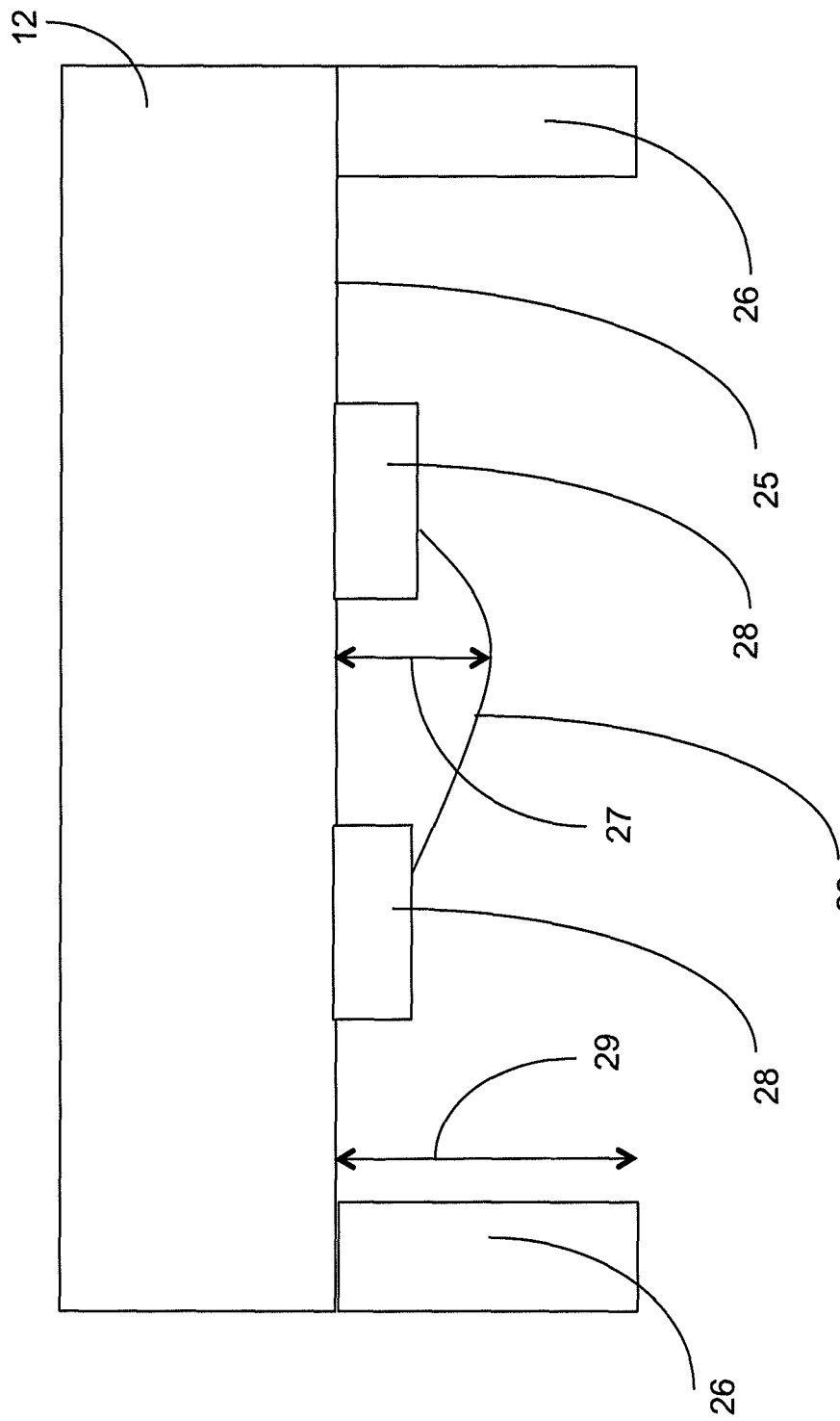

FIG. 3A part (c) shows how the uniform mounting risk is mitigated by using a bonding ring 26. Preferably the bonding ring 26 surrounds each IC, die, chip or passive component. The bonding ring 26 should be at least slightly higher than any surface topography on any of the ICs or dies 12, including any interconnect 28 on the active side of the ICs or dies 12. For example, FIG. 3D shows an IC or die 12 with surface topography 28, which may include an interconnect such as a wire bond 28 on the active face 25 of the IC or die 12. The surface topography 28 and interconnect 28 has a maximum height 27 from the active face 25 of the die 12. As shown in FIG. 3D, the bonding ring 26 has a height 29 from the active face 25 of the die 12, and the height 29 is greater than the height 27. Using a bonding ring 26 ensures that the surface topography of the IC 12 will not cause any front-side plating, so that the die 12 are uniformly mounted and the active side of the die is protected, as shown in the photograph of FIG. 3C.

Further by using a double bonding ring 26 with a first ring adjacent to a second ring, where the first ring is higher and narrower than the second ring, the bonding of the die in the adhesive 16 may be a self-terminating bonding process. This is so because the first bonding ring 30, which is higher and narrower is bonded first into the adhesive, then as the second ring which is wider and has a greater area, encounters the adhesive, the bonding pressure reduces. This is so because the formula for pressure is P=F/A. The bonder force remains the same, but because the second ring has a greater area the bonding pressure is reduced and the bonding process self-terminates. Therefore the hot-embossing process of the IC 12 to the adhesive 16 is fully controllable, and may be terminated at a pre-determined depth, which is set by the thickness of the second bonding ring 32. The bonding process may use a SET FC-300 bonder.

Figure 4:
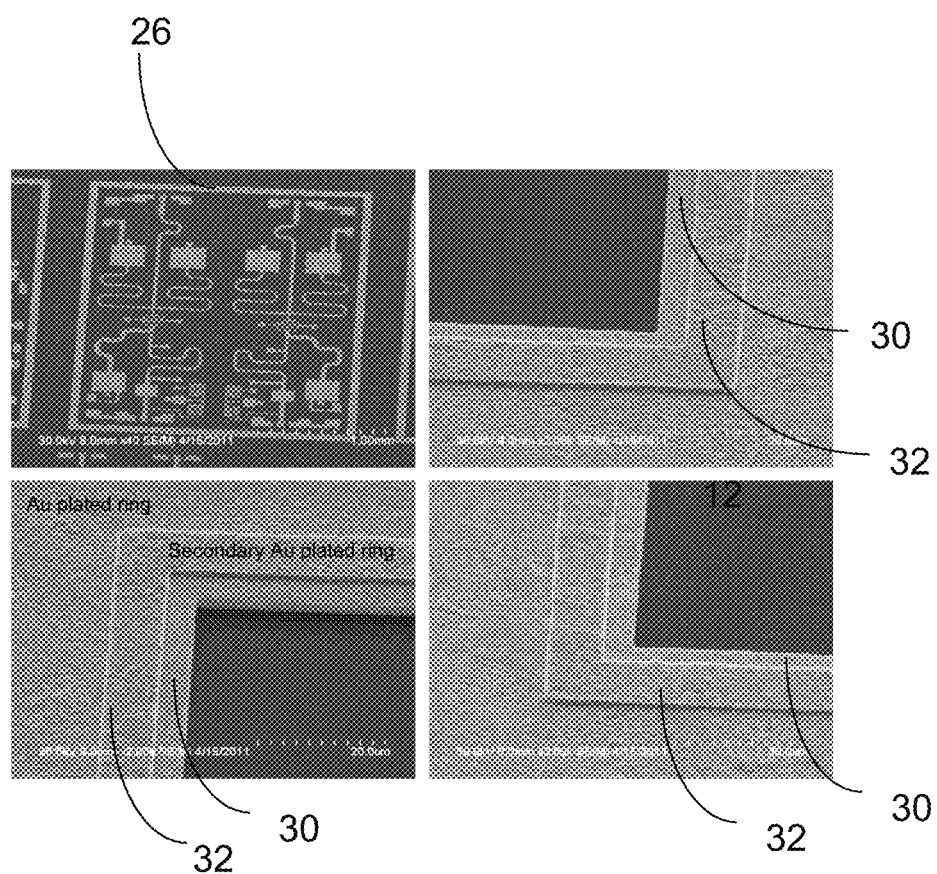
FIG. 4 shows a scanning electron image of a double electroplated bonding ring surrounding each circuit in accordance with the present disclosure.

FIG. 4 shows a scanning electron image of a double electroplated bonding ring 26 surrounding each circuit. The double electroplated bonding ring 26 has a first ring 30 and a second ring 32 adjacent the first ring 30. To form the double electroplated bonding ring 26 a double electroplating process may be used, using a common plating membrane. The bonding rings 30 and 32 shown in FIG. 4 were plated at their respective thicknesses uniformly across a 3-inch test Si wafer. A person skilled in the art would understand that the first and second bonding rings need not be adjacent to each other to have the same effect, although that may be the best use of die area. A person skilled in the art would also understand that the first bonding ring 30 may be inside the second bonding ring 32, as shown in FIG. 4, and that the first bonding ring 30 may also be formed outside the second bonding ring 32. The first 30 and second bonding rings 32 may be separate or the second bonding ring 32 may be deposed on the first bonding ring 30.

During bonding in the adhesive 16 on the carrier substrate 14, it is important to protect the front active side of the ICs 12 including any interconnect 28 on the active side, as shown in FIG. 3A, because the front active side of the ICs 12 face the carrier substrate 14.

Figure 5:
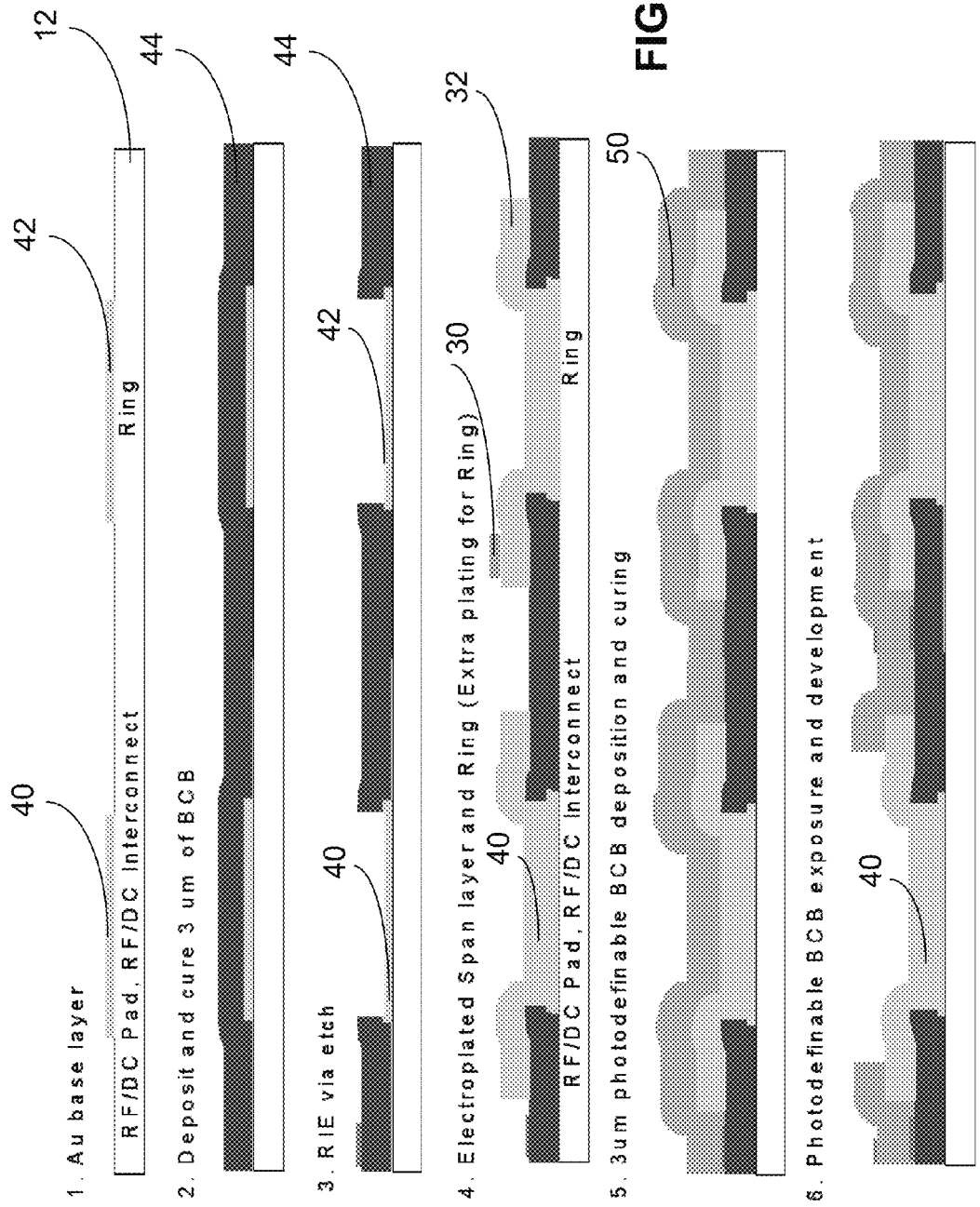
FIG. 5 shows process steps for fabricating a double bonding ring on a die in accordance with the present disclosure.
Figure 7:
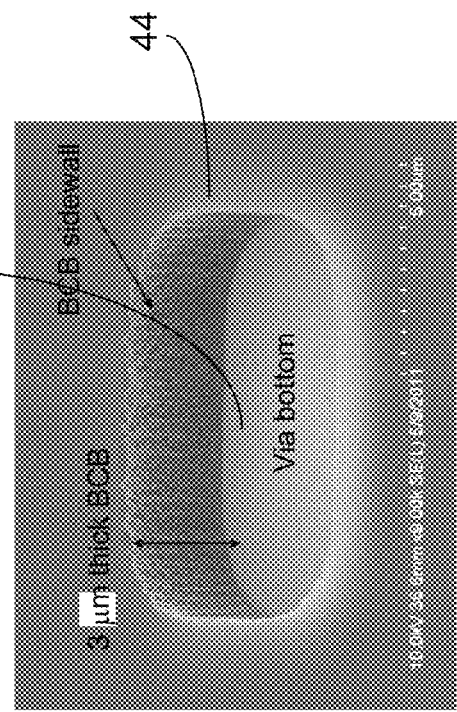
FIG. 7 shows a scanning electron image of etched BCB around a small via after step 3 of FIG. 5 in accordance with the present disclosure.

FIG. 5 shows a cross section during fabrication and the steps for forming the double ring 26 to provide uniform mounting and also steps for front-side protection. As shown in step 1 of FIG. 5, an Au base layer or any other metal suitable for interconnect, which may be 3 μm thick, is deposited on the IC 12. The Au base layer forms the base layer for radio frequency (RF) and direct current (DC) pads 40 and RF/DC interconnects 40, and also a base layer 42 for the second ring 32. Then as shown in step 2 of FIG. 5, benzocyclobutene (BCB) 44 is spun coated over the device 12 and cured. Then as shown in step 3 of FIG. 5, the BCB 44 is then patterned and etched to expose base layers 40 and 42 using a reactive ion etching (RIE) process, which ensures that very small features may be etched with almost vertical sidewalls, as shown in FIG. 7. Such small features may be vias, which may, for example, have dimensions of 3 um high×8 um in length and width, or 3 um high×8 um in diameter. Small vias may also have other dimensions.

It is important that no residue is left on the BCB sidewalls and no veils collapse at the bottom of the etched BCB patterns. If such veils remain on the surface of the wafer, they can cause open circuits and significantly deteriorate the circuit performance. The most critical areas may be source pad vias, which may have small dimensions as discussed above.

Figure 6:
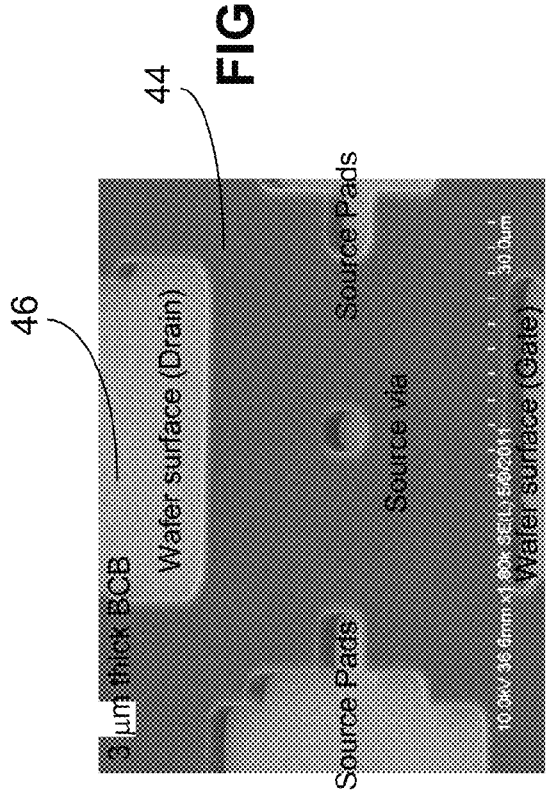
FIG. 6 shows a scanning electron image of etched BCB after step 3 of FIG. 5 in accordance with the present disclosure.

The results shown of step 3 are shown in FIGS. 6 and 7 and were achieved on Si test wafers. FIG. 6 shows a scanning electron image of the etched BCB on a silicon test wafer. The etched areas 46 correspond to the area needed for a GaN device. FIG. 7 shows a scanning electron image of etched BCB 44 surrounding a small via 48 with an almost vertical sidewall. Such vias are used in the source pad area over the GaN devices. The goal is to have clean BCB sidewalls with no hanging veils and a clean via bottom, as shown in FIG. 7. SEM images for entire wafers show that the method used can obtain very good results across a 3-inch test Si wafer.

Next, as shown in step 4 of FIG. 5, electroplating is performed to form the RF/DC pads 40 and RF/DC interconnects 40 and to form the second ring 32 and the first ring 30.

The next step in wafer processing is coating the wafer with photodefinable BCB 50, as shown in step 5 of FIG. 5, to provide protection for the devices during wafer handling. The photodefinable BCB 50 may be 4022-35 photo definable BCB made by Dow Chemical, which is a polymer, which may be spun coated over the existing dry etched BCB. The photodefinable BCB 50 may be spun coated over the whole wafer including the first and second rings 30 and 32. The coated first 30 is higher than any other feature on the die 12.

Then the photodefinable BCB 50 may be lithographically exposed, developed and cured, as desired, as shown in step 6 of FIG. 5, for example to open RF pads.

Figure 8:
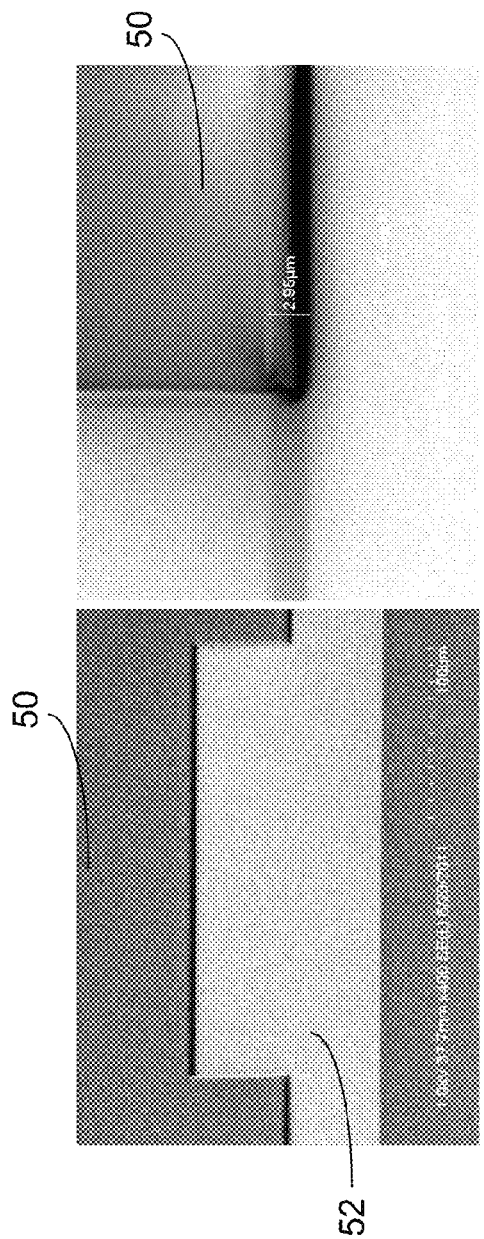
FIG. 8 shows a scanning electron image of the developed and cured photodefinable BCB in accordance with the present disclosure.
Figure 9:
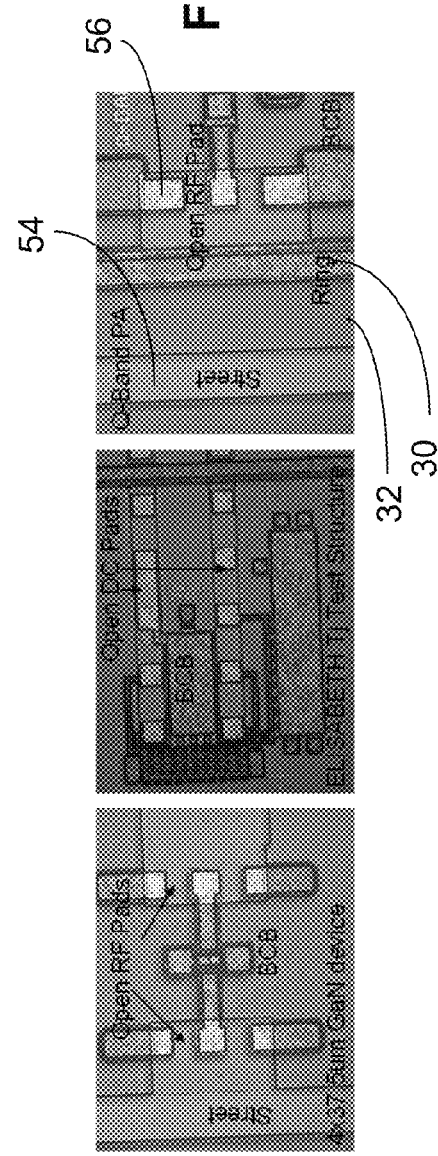
FIG. 9 shows an optical image of the developed and cured photodefinable BCB, in which the open areas correspond to RF/DC pads and front side streets for dicing the die in accordance with the present disclosure.

FIG. 8 shows a scanning electron image of an exposed, developed and cured photodefinable BCB 50 on a Si test wafer. The openings 52 on the photodefinable BCB 50 correspond to RF and DC pads 56 on the devices as well as streets 56 that separate the various dice on each reticle. FIG. 9 shows optical images of developed and cured photo definable BCB. The open areas correspond to RF/DC pads 56 and front side streets 54. Also shown are rings 30 and 32.

After step 6 of FIG. 5 the die surrounded by ring 26 may be bonded with adhesive to a carrier wafer, as shown in FIG. 3A. Next the die and other die on the carrier wafer 14 may be backside electroplated in order to electroform the heat sink 18, as shown in step 2 of FIG. 1, and then planarized as shown in step 3 of FIG. 1. Subsequently, the planarized heat sink 20, which may be Cu, with the embedded die 12 may be released from the carrier wafer 14, as shown in step 4 of FIG. 1.

In order to demonstrate that the same approach can be used for other types of circuits and passive components, a Lange coupler circuit was fabricated on a 250 μm thick AlN substrate, which required placing a dielectric support under airbridges and creating a bonding ring 26 surrounding the entire Lange coupler circuit.

Figure 10:
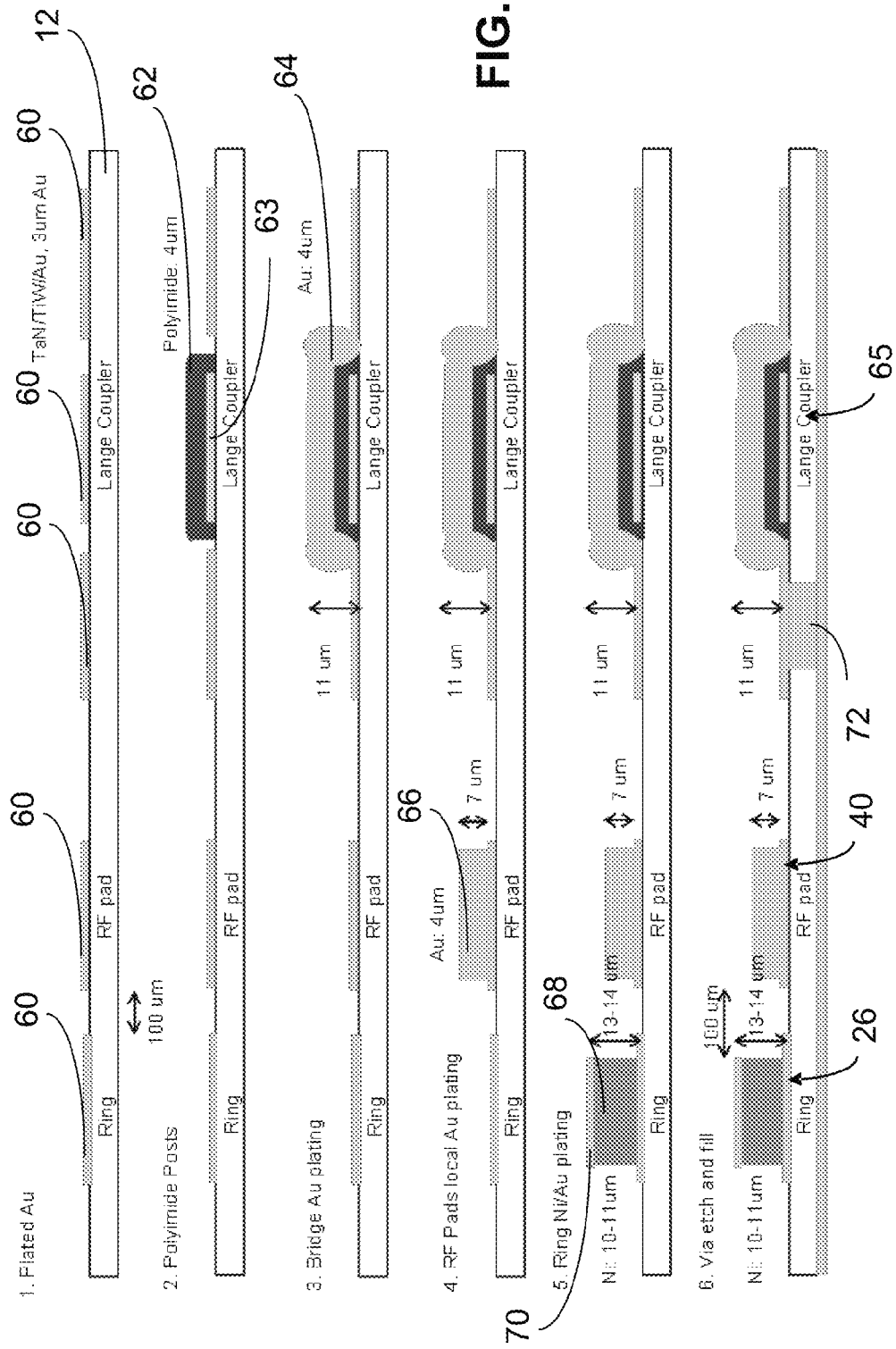
FIG. 10 shows process steps for fabricating a double bonding ring on a die having bridges for conductors, such as for a Lange coupler, in accordance with the present disclosure.

FIG. 10 shows the process flow for fabricating complex devices including those with passive components and air bridges, such as a Lange coupler 65.

As shown in step 1 of FIG. 10, an TaN/TiW/Au base layer followed by a 3 μm thick layer of Au 60 is formed on the die 12, which may be AlN. The base layer 60 forms the base layer for the ring 26, the RF/DC pads and interconnects 40, and the Lange coupler 65.

Then as shown in step 2 of FIG. 10, a polyimide support bridge 62, which may be 4 μm thick, is deposited over the center conductor 63 of the Lange coupler 65. Then as shown in step 3 an Au bridge 64, which may be 4 μm thick, is deposited over the polyimide support bridge 62 to connect the conductors on either side of the center conductor 63 of the Lange coupler 65, creating what is known as an air bridge. The combination of the base layer 60, the polyimide support bridge 62, and the Au bridge 64 may be 11 μm thick.

Then as shown in step 4 of FIG. 10, Au 66 which may be 4 μm thick, is deposited on the RF/DC pads. The combination of the base layer 60 and the Au 66 may be 7 μm thick. Steps 3 and 4 may be done simultaneously.

Next as shown in step 5 of FIG. 10, Ni 68, which may be 10-11 μm thick, is electroplated to form the ring 26, which as shown in FIG. 10, is a structure comprising the gold 60, the Ni 68 and a thin layer of Au 70, which is flashed onto the Ni. Less expensive Ni is used instead of all Au to save cost. As discussed above the ring 26 is a double ring of the first ring 30 and second ring 32. The ring 26 has a height of 13-14 μm, which is greater than the 11 μm height of the Lange coupler air bridge. To provide for self termination of the bonding process as described above, ring 26 may have a first ring 30 which is higher and narrower than the second ring 32. The first ring 30 is bonded first into the adhesive. Then as the second ring 32, which is wider and has a greater area than the first ring 30, encounters the adhesive, the bonding pressure reduces and the bonding process self terminates at a controlled depth into the adhesive on the carrier.

Finally, as shown in step 6 of FIG. 10 vias 72 may be etched and filled. The vias 72 are used for connecting the Lange coupler's 50 Ohm thin film resistor to ground and for RF grounding the bonding ring 26 in order to eliminate parasitic resonances in the passband of the circuit.

In this process in step 4 of FIG. 10, in order to facilitate the subsequent interconnection of the Lange coupler circuit with GaN ICs, the RF pads were plated an additional 4-5 um beyond what is needed for interconnect. The extra thickness reduces the height differential between the bonding ring 26 and the RF pad 66 to make it easier to planarize encapsulating dielectric which is deposited over the device for protection during device handling.

As shown in step 1 of FIG. 10, the distance between the bonding ring 26 and the RF pad 66 may be 100 μm. As discussed above, the total height of the Lange coupler polymer supported bridges in this example is 11 μm, which consists of 3 μm of TaN/TiW/Au metal, 4 μm of polyimide, and 4 μm of plated Au. The bonding ring 26 in this example has a total height of 13-14 μm, in order to be 2-3 μm higher than the bridges.

Figure 11:
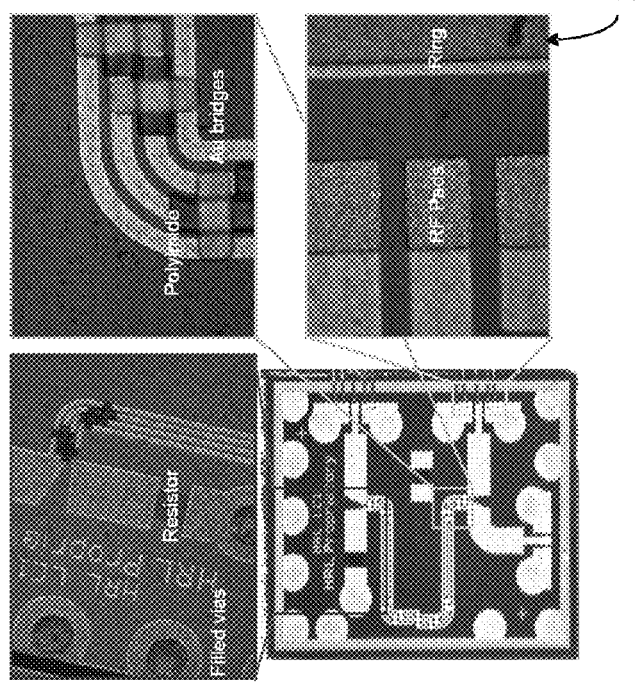
FIG. 11 shows photographs of a Lange coupler, showing the double bonding ring, RF pads, polymer supported bridges, thin film resistors and filled backside vias in accordance with the present disclosure.
Figure 12:
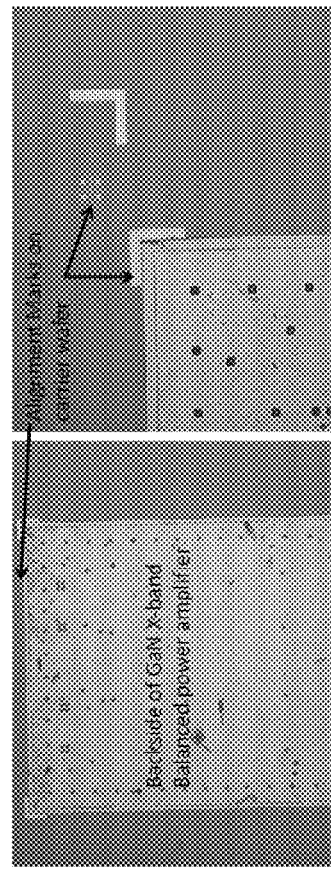
FIG. 12 shows photographs of GaN power amplifiers mounted on a Si carrier wafer, showing excellent alignment in accordance with the present disclosure.

FIG. 11 shows photographs of fabricated AlN Lange couplers, which show the bonding ring, RF pads, polyimide supported bridges, thin film resistors and filled backside vias. FIG. 12 shows photographs of a GaN power amplifier (PA) mounted with adhesive on a Si carrier wafer, and shows that excellent alignment was achieved after the wafer mounting. FIG. 12 also shows an example of an GaN IC mounted with its active face down onto a carrier wafer using a polymer adhesive.

After step 6 of FIG. 10 the circuit surrounded by ring 26 may be bonded with adhesive to a carrier wafer. Next the components including the Lange coupler, shown in the example of FIG. 10, may be backside electroplated in order to electroform the heat sink 18, as shown in step 2 of FIG. 1, and then the heat sink 18 may be planarized to form a planarized heat sink 20, as shown in step 3 of FIG. 1. Subsequently, the heat sink 20, which may be Cu, with the embedded electronic components may be released from the carrier wafer 14, as shown in step 4 of FIG. 1.

Figure 13:
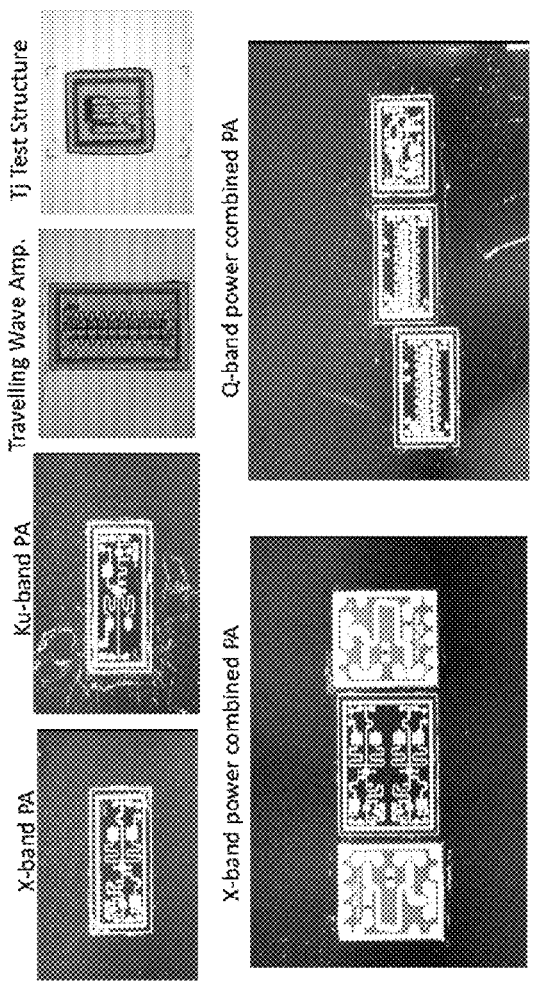
FIG. 13 shows photographs of various GaN and AlN circuits embedded in electroformed heat sinks in accordance with the present disclosure.

FIG. 13 shows photographs of various GaN and AlN circuits embedded in electroformed heat sinks. By using a surface profilometer, the height difference between the surface of the GaN and AlN circuits and the electroformed Cu heatsink was measured. In all cases the gap was measured to be between 1 μm to 2 μm, which corresponds to the greater thickness of the metallic bonding ring that surrounds each circuit. These measurements demonstrate the success of the bonding ring as a method to control the bonding process.

Figure 14:
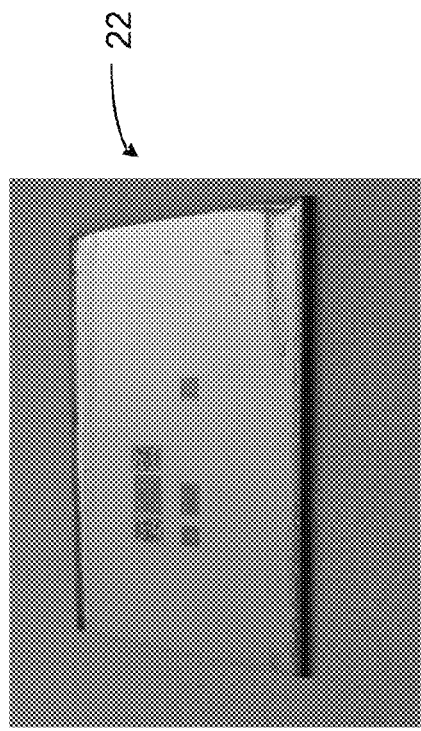
FIG. 14 shows a photograph of an ITAP after being released from a carrier substrate in accordance with the present disclosure.

FIG. 14 shows an example of an electroformed ITAP 22 after its release from the carrier substrate or wafer. The ITAP 22 has embedded GaN and AlN circuits.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of mounting a plurality of semiconductor or microelectronic chips or dies, comprising:
   providing a carrier;
   temporarily adhering said plurality of semiconductor or microelectronic chips or dies to said carrier with active faces of said chips or dies facing towards said carrier;
   covering backsides of said chips or dies and filling empty spaces between said chips or dies with a metallic material to thereby define an assembly of said chips or dies and said metallic material; and
   releasing the assembly from said carrier;
   wherein each chip or die comprises at least one bonding ring having a height from the active face of the respective chip or die that is greater than a maximum height of surface topography on the active face of the respective chip or die;
   wherein each bonding ring comprises a first bonding ring around the active face of the respective chip or die, and a second bonding ring around the active face of the respective chip or die;
   wherein the first bonding ring is higher than the second bonding ring; and
   wherein the second bonding ring has a larger area than the first bonding ring.

2. The method of claim 1 wherein the first bonding ring is narrower than the second bonding ring.

3. The method of claim 1 wherein temporarily adhering said plurality of semiconductor or microelectronic chips or dies to said carrier with active faces of said chips or dies facing towards said carrier comprises:
   applying a force to a backside of each chip or die so that the first bonding ring is embedded in a temporary adhesive on the carrier;
   wherein when the second bonding ring encounters the temporary adhesive, a bonding pressure from the force is reduced due to the larger area of the second bonding ring, thereby controlling a depth that the first bonding ring is embedded into the temporary adhesive.

4. The method of claim 1 wherein an exposed surface of said metallic material is planarized prior to releasing the assembly from said carrier.

5. The method of claim 1 further comprising forming a pattern of interconnections between the active faces of the chips or dies.

6. The method of claim 1 wherein:
   the step of temporarily adhering said plurality of semiconductor or microelectronic chips or dies to said carrier with active faces of said chips or dies facing towards said carrier is accomplished using a temporary adhesive.

7. The method of claim 1 wherein:
   the metallic material preferably completely encapsulates the plurality of chips or dies with the exception of the active faces of the plurality of chips or dies, which are protected from contact with said metallic material by said bonding ring.

8. The method of claim 1 wherein the step of covering backsides of said chips or dies with said metallic material includes a step of covering the backsides of said plurality of chips or dies with a seed metallic layer.

9. The method of claim 1 wherein the metallic material is in void-free thermal contact with the backsides of said plurality of chips or dies.

10. The method of claim 1 wherein differences in thicknesses of said plurality of ICs are absorbed in the planarized metallic material, the planarized metallic material providing, in use, a heat sink for each of said plurality of chips or dies.

* * * * *